(12) United States Patent
Baumheinrich et al.

(10) Patent No.: US 8,239,150 B2
(45) Date of Patent: Aug. 7, 2012

(54) SYSTEM, DEVICE, AND METHOD FOR DETECTING ELECTRICAL DISCHARGES ON A STRUCTURE

(75) Inventors: Thorsten Frank Baumheinrich, Altdorf (DE); Marko Klaus Baller, Saarbrücken (DE); Yaru Najem Mendez Hernandez, Munich (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/108,046

(22) Filed: May 16, 2011

(65) Prior Publication Data

US 2012/0029853 A1 Feb. 2, 2012

(51) Int. Cl.
*G06F 19/00* (2011.01)
(52) U.S. Cl. .......... 702/65; 702/4; 702/189; 324/72; 174/117; 342/460
(58) Field of Classification Search .......... 702/4, 65, 702/66, 127, 182, 183, 187, 188, 189; 324/113, 324/96, 72, 72.5, 722; 340/601; 361/117; 174/2; 342/460
See application file for complete search history.

(56) References Cited

U.S. PATENT DOCUMENTS

| | | | | |
|---|---|---|---|---|
| 4,288,830 A * | 9/1981 | Brasfield | | 361/56 |
| 4,914,444 A * | 4/1990 | Pifer et al. | | 342/460 |
| 5,184,215 A * | 2/1993 | Barker | | 348/159 |
| 5,295,072 A * | 3/1994 | Stevens et al. | | 702/4 |
| 5,303,152 A * | 4/1994 | Moses et al. | | 702/4 |
| 5,331,330 A * | 7/1994 | Susnjara | | 342/460 |
| 5,699,245 A * | 12/1997 | Herold | | 702/4 |
| 5,771,020 A * | 6/1998 | Markson et al. | | 342/460 |
| 6,741,069 B1 * | 5/2004 | Klemar et al. | | 324/72 |
| 6,788,043 B2 * | 9/2004 | Murphy et al. | | 324/72 |
| 7,400,054 B2 * | 7/2008 | Wesselink | | 290/44 |
| 7,468,505 B2 * | 12/2008 | Kraemer | | 250/227.11 |
| 7,765,864 B2 * | 8/2010 | Bernus | | 73/170.16 |
| 7,806,657 B2 | 10/2010 | Schram et al. | | |
| 7,869,953 B1 * | 1/2011 | Kelly et al. | | 702/4 |
| 2005/0258971 A1 * | 11/2005 | Greenstein et al. | | 340/601 |
| 2007/0291483 A1 * | 12/2007 | Lys | | 362/227 |
| 2008/0228331 A1 * | 9/2008 | McNerney et al. | | 701/3 |
| 2009/0296303 A1 * | 12/2009 | Petersen | | 361/120 |
| 2010/0077850 A1 * | 4/2010 | Matsushita | | 73/170.24 |
| 2010/0280797 A1 | 11/2010 | Erichsen | | |
| 2010/0328084 A1 * | 12/2010 | Kraemer | | 340/601 |
| 2011/0267027 A1 * | 11/2011 | Iannotti et al. | | 324/72 |

OTHER PUBLICATIONS

Vidyadhar Peesapati and Ian Cotton; Lightning Protection of Wind Turbines—A Comparison of Lightning Data & IEC 61400-24; International Conference on Sustainable Power Generation and Supply, Apr. 6-7, 2009; pp. 1-7.

(Continued)

*Primary Examiner* — Carol Tsai
(74) *Attorney, Agent, or Firm* — Jason K. Klindtworth (57) ABSTRACT

A lightning detection and damage estimation system for a structure is disclosed herein. The system includes a lightning receptor coupled to a lightning conductor configured to receive multiple lightning strikes and induce lightning current in a pick-up coil coupled to the lightning conductor. An integrated circuit coupled to the lightning conductor via the pick-up coil includes a non-volatile memory for successively storing one or more samples of the lightning induced current for the multiple lightning strikes. A damage estimation unit is configured to estimate a condition of the structure based on analyzing a history of stored samples of the lightning induced current of the multiple lightning strikes from the non-volatile memory.

17 Claims, 7 Drawing Sheets

OTHER PUBLICATIONS

Bastian Lewke et al ; Wind Turbine Protection; U.S. Appl. No. 12/058,018, filed Mar. 28, 2008; 23Pages.

Bastian Lewke et al; Wind Turbine Lightning Protection System; U.S. Appl. No. 12/229,334, filed Aug. 21, 2008; 19 Pages.

Sebastian Kraemer et al.; Micro-Electromechanical Current Sensing Apparatus; U.S. Appl. No. 12/051,290, filed Mar. 19, 2008; 24 Pages.

Yaru Najem Mendez Hernandez et al; Transversal Conduction Lightning Protection System; U.S. Appl. No. 12/491,520, filed Jun. 25, 2009; 19 Pages.

Sebastian Kraemer; System and Method for Detecting Lightning; U.S. Appl. No. 12/493,283, filed Jun. 29, 2009; 31 Pages.

Glen Peter Koste; System for Estimating a Condition of a Non-Conductive Hollow Structure Exposed to a Lightning Strike; U.S. Appl. No. 12/1846,099, filed Jul. 29, 2010; 37 Pages.

Glen Peter Koste et al.; System and Method for Detecting Lightning Strikes Likely to Affect a Condition of a Structure; U.S. Appl. No. 12/955,325, filed Nov. 29, 2010; 21 Pages.

* cited by examiner

SYSTEM, DEVICE, AND METHOD FOR DETECTING ELECTRICAL DISCHARGES ON A STRUCTURE

BACKGROUND

The present invention generally relates to electrical discharge detection techniques for structures, and more particularly, to a system, device and method to estimate a condition of a structure due to such electrical discharges.

Various structures, such as, but not limited to, wind turbines, aircrafts, marine structures, communication towers, or other tall structures, may be exposed to electrical discharges due to e.g., lightning strikes. For example, wind turbine blades have become increasingly susceptible to lightning strikes as the dimensions of the wind turbine blades have increased. Moreover, wind turbine blades may be adversely affected when exposed to lightning strikes. Consequently, this can result in reduced productivity since a relatively long period of down-time may be needed to inspect and further repair and/or replace an affected blade or component.

Several lightning detection systems applicable to wind turbines have been proposed in the past. The basic approach in such systems is to provide several magnetic and/or electric field sensors distributed along the length of a rotor blade of the wind turbine and to measure the magnetic and/or electric field concentration along the rotor blade. An evaluation unit connected to the magnetic and/or electric field sensors receives measurement signals thereof, and calculates damage to the wind turbine and, in particular, to the rotor blade caused by a lightning strike. However, an evaluation based on the measured magnetic and/or electric field concentration does not necessarily provide for estimating the condition of individual components or parts of the wind turbine.

In order to address the above need, one common detection system employs magnetic cards positioned on various parts of the wind turbine, wherein a magnetic field generated by a lightning strike marks traces on a magnetic strip of the magnetic card. Such a technique enables reading the maximum lightning current to which the blade was exposed. However, the readings need to be read manually by interrupting the wind turbine operation. Also, the technique does not enable recording of several lightning strikes occurring in a sequence and/or the time of occurrence of the strikes. Furthermore, only the latest of the lightning strikes having the highest magnitude is registered in the magnetic card due to an assumption that a lightning current of high magnitude may lead to a high probability of damage on the structure in comparison to a relatively lower magnitude lightning strike. For example, in the event that a lightning strike having a lightning current of a magnitude lower than a first threshold value, e.g., 30 kA, is discharged, the lightning strike may not be registered on the magnetic card. Conversely, in the event that a lightning strike having a lightning current of a magnitude higher than a second threshold say, about 50 kA, the lightning strike may be registered on the magnetic card. However, a sequence of low magnitude lightning strikes occurring over a period of time may also lead to a potential risk of damage to the structure, but may nonetheless not be recorded.

One attempt to address the drawback associated with the aforementioned magnetic card system may include using electronic storage mediums for registering lightning strikes. However, the need for a constant supply of power to retain stored data renders them incapable of being mounted on rotary components such as the blades of the wind turbine. Although, rechargeable/replaceable batteries may provide the power required by such storage mediums, the need for continuous replacement of the batteries over a period of time makes them unsuitable for remote, off-shore applications where manual intervention is few and far-between.

Therefore, a need exists for an improved lightning detection system that may address one or more of the problems set forth above.

BRIEF DESCRIPTION

In accordance with one aspect of the invention, an integrated circuit for detecting lightning strikes on a structure is provided. The integrated circuit includes a processing unit for extracting lightning induced current from multiple lightning strikes incident on the structure. The integrated circuit further includes a non-volatile memory for successively storing one or more samples of the lightning induced current for each of the plurality of lightning strikes.

In accordance with another aspect of the invention, a lightning detection and damage estimation system for a structure is provided. The system includes a lightning conductor for receiving multiple lightning strikes and produce lightning induced current for each of the multiple lightning strikes. An integrated circuit coupled to the lightning conductor and mounted on the structure includes a non-volatile memory and a damage estimation unit. The non-volatile memory is configured to successively store one or more samples of the lightning induced current for each of the plurality of lightning strikes. The damage estimation unit is configured to estimate a condition of the structure based on analyzing a history of stored samples of the lightning induced current for the multiple lightning strikes from the non-volatile memory. The lightning detection system further includes an energy harvesting unit configured to harness energy from the lightning induced current to power the integrated circuit.

In accordance with another aspect of the invention, a method in an integrated circuit for detecting lightning strikes on a structure is provided. The method includes receiving current induced by each of a multiple lightning strikes from a lightning conductor coupled to the integrated circuit and successively storing on a non-volatile memory one or more samples of the lightning induced current for each of the multiple lightning strikes. The method further includes estimating a condition of the structure based on analyzing a history of stored samples of the lightning induced current of the plurality of lightning strikes from the non-volatile memory.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As described in detail below, embodiments of the present invention provide a system for detecting lightning strikes and estimating the damage caused by lightning strikes and a device and method for the same. Lightning is detected via measuring a number of lightning parameters such as, but not limited to lightning current, and a magnetic field induced by the lightning current. The system includes a lightning conductor that conducts lightning current, and generates lightning induced current in a pick-up coil coupled therewith, for example, based on electromagnetic induction. The pick-up coil channels the lightning induced current to an integrated circuit for further processing. The system includes a damage estimation unit which estimates damage due to lightning based on the data processed in the integrated circuit.

Figure 1:
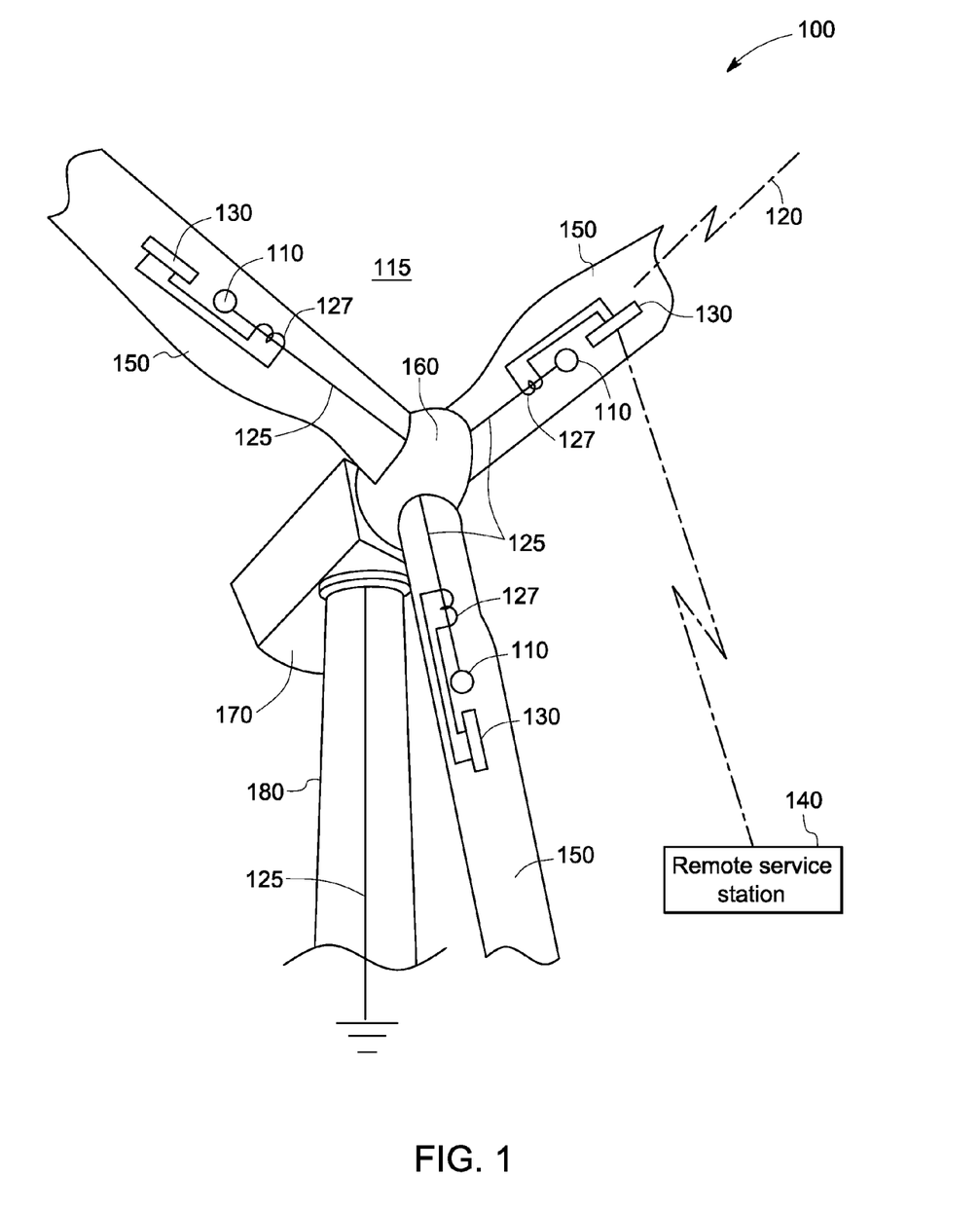
FIG. 1 is a schematic representation of an exemplary lightning detection system in accordance with an embodiment of invention.

In an illustrated embodiment of the invention as shown in FIG. 1, a schematic representation of the lightning detection system 100 for a structure 115 is depicted. The lightning detection system includes a lightning receptor 110 disposed on the structure 115 and susceptible to a lightning strike 120. Non-limiting examples of the structure 115 include wind turbines, aircraft, marine structures, high-rise buildings, chimneys, antennas, radio towers, monumental installations, and bridges. For ease of understanding, embodiments of the invention will be described with reference to a wind turbine structure 115, however the teachings herein may similarly be applied to other such structures. The wind turbine 115 is formed of multiple rotary or non-rotary components including blades 150, nacelle 170, hub 160, and tower 180. A lightning strike may be captured by means of one or more lightning receptors 110 arranged on the blades and electrically connected to one or more lightning conductors 125. The lightning receptor 110 is an element capable of receiving and conducting lightning to the lightning conductor 125. The lightning receptor may also form a structural part of the structure which is designed to conduct lightning current. In an embodiment, the lightning receptor 110 is an air termination system. In one embodiment, the lightning receptor 110 is metallic. The lightning conductor 125 is a grounding device for grounding lightning current to prevent damage to the wind turbine structure 115. In an exemplary embodiment, the lightning conductor 125 is a twisted pair cable however other grounding mechanisms may be used. When a lightning strike 120 strikes a component such as 150, 160, 170, or 180 of the structure, a lightning current incident on the component (150, 160, 170, or 180) is conducted through the lightning conductor 125 of the component (150, 160, 170, or 180).

An electromagnetic pick-up coil 127 electrically coupled to the lightning conductor 125 responds to an electromagnetic field induced by the lightning current conducted through the lightning conductor 125. An induced current proportional to the lightning current is generated in the electromagnetic pick-up coil 127. In one embodiment, the electromagnetic pick-up coil 127 may be a Rogowski coil or a shunt resistance. An integrated circuit (IC) 130 estimates a condition of the structure 115 disposed on the component (150, 160, 170, or 180) adjacent to the conductor 125. The IC 130 receives the lightning induced current flowing across the conductor 125 via the pick-up coil 127 and registers lightning activity. The term "lightning induced current" used herein refers to current caused by a lightning strike 120. As the lightning induced current is received, the IC 130 processes the lightning induced current and stores a profile of the lightning induced current representative of the lightning activity. A damage estimation unit (not shown) within the IC 130 or outside the IC 130 estimates a condition of the component (150, 160, 170, or 180) using the profile of the lightning induced current stored in the IC 130 and wirelessly transmits estimated data to a remote service station 140. In an embodiment the functions performed by the damage estimation unit can be performed by the processing unit 240.

Figure 2:
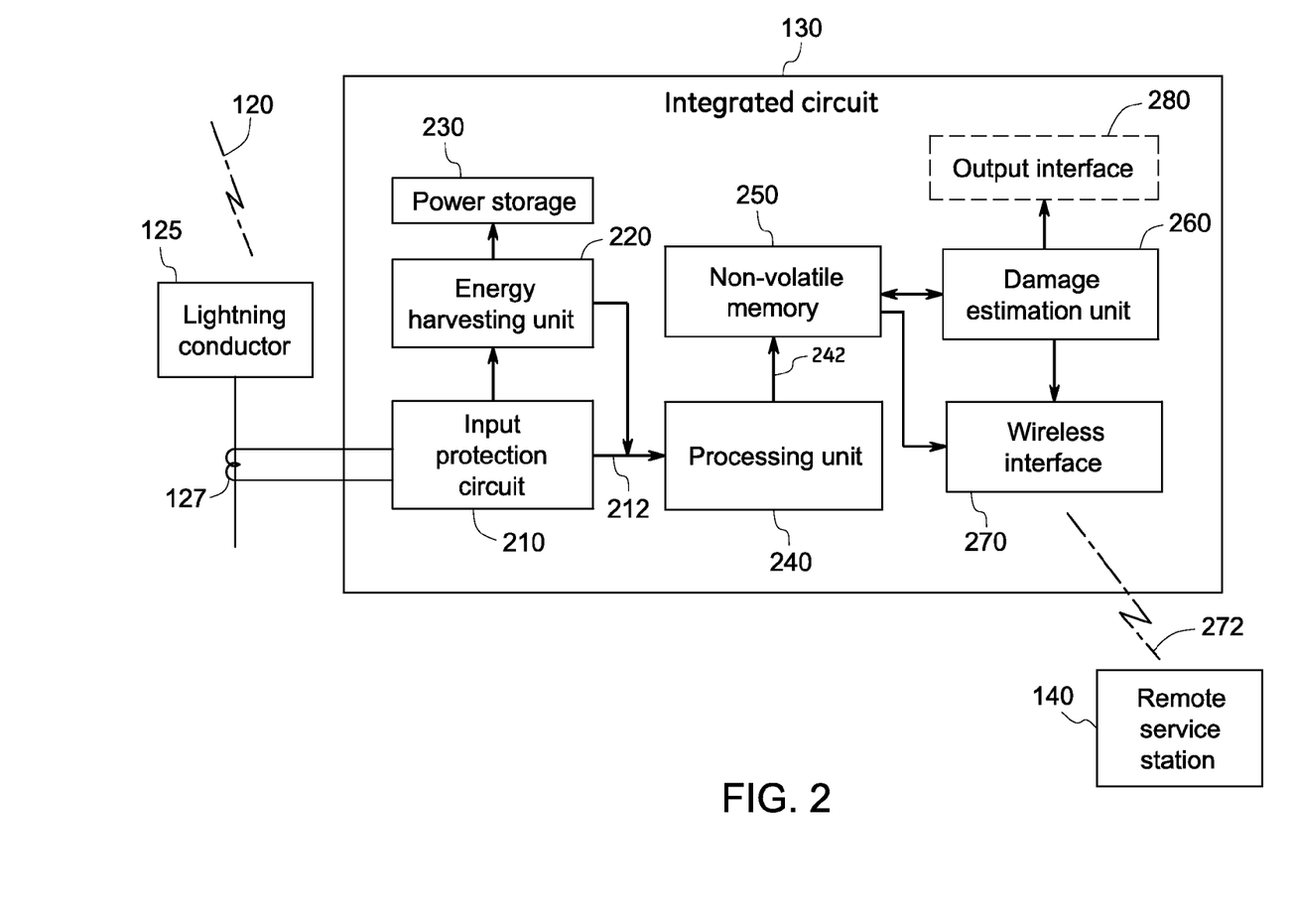
FIG. 2 is a block diagram representation of the exemplary lightning detection system in FIG. 1 including an integrated circuit in accordance with an embodiment of the invention.

FIG. 2 illustrates a block diagram representation of an exemplary lightning detection system 100 (FIG. 1) including an integrated circuit (IC) 130. The lightning detection system 100 may include multiple ICs 130 that detect and register multiple lightning strikes as well as localized impact of a lightning strike on a component such as, but not limited to, a blade 150 in FIG. 1. For simplicity, the few embodiments of the invention will be described with reference to a single IC. The IC 130 may be packaged in any IC carrier that offers compactness and portability to the IC. Few examples of an IC carrier among others are dual in-line package (DIP), chip-on-flex (COF), chip-on lead (COL), pin grid array, bump chip carrier (BCC), and ceramic flat pack (CFP). One or more ICs 130 may be mounted on each of the one or more components (150, 160, 170, and 180) of the structure 115 at an optimal distance from each other. As used herein, the optimal distance is defined as the minimum distance that is required between two lightning conductors in order to detect a lightning strike by at least one of the lightning conductors. The optimal distance may be determined considering other factors such as the sensitivity of the lightning detector, an average intensity if the lightning strikes, and the dimensions of the component on which the lightning conductors are disposed. For example, the ICs 130 may be mounted adjacent lightning conductor 125 disposed at around 3 to 10 meters from each other. When a lightning strike 120 impacts a component (150, 160, 170, or 180), a lightning conductor 125 located at or nearest the point of impact receives lightning current through the lightning receptor 110 and in turn, induces a lightning current in an electromagnetic pick-up coil 127 electrically coupled to the lightning conductor 125. The lightning current induced in the pick-up coil 127 is scaled according to the number of turns in the coil 127. The IC 130 coupled to the pick-up coil 127 receives the lightning induced current and conducts the received current through a series of electronic components of an input protection circuit 210.

The input protection circuit 210 is provided at the output of the pick-up coil 127 in order to protect downstream electronics in the IC 130 from overcurrent and overvoltage surges. In order to avoid manual intervention on the input protection circuit 210, resettable protective devices can be used, together with surge suppression devices. The voltage output 212 from the input protection circuit 210 is sampled by a processing unit 240 and the sampled waveform 242 of the lightning induced current is digitized and stored in a non-volatile memory 250 within the IC 130.

The processing unit 240 samples the lightning waveform at a sampling rate determined by the clock-speed of a clock generator within the processing unit 240. The sampled waveform is digitized and stored in the non-volatile memory 250 along with a time and date stamp indicating a time of occurrence of the lightning strike. In an embodiment, the IC 130 includes an energy harvesting unit 220 including a voltage regulator coupled to the input protection circuit 210. The energy harvesting unit 220 will be discussed in more detail with reference to FIG. 6 later.

The non-volatile memory 250 is a removable solid-state storage device capable of retaining stored information even when not powered. In an example embodiment, the non-volatile memory 250 is a flash memory. Typically, flash memory stores information in an array of memory cells and can sometimes store more than one bit of information per cell. When a flash store is to be updated, the flash file system writes a new copy of the changed data to a fresh block, remaps file pointers, and then erases the old block. Since flash memory spread writes over the array of cells it is capable of storing a sequence of data successively as opposed to other forms of non-volatile memory such as a magnetic card in which new data is written over/in place of old data. Thus, multiple lightning strikes incident in a short-sequence of time or over a longer period of time can be detected and stored in the flash type non-volatile memory 250 as a history. For example, the recording of the digitized waveforms of a series of lightning strikes can be repeated several times in close succession, e.g., every 0.1 to 10 μs until an end of lightning activity is detected. For example, an end of lightning activity may be determined when a detected lightning current value falls below a predetermined level.

In an embodiment, the IC 130 includes a damage estimation unit 260 for estimating a condition of the component (150, 160, 170, or 180) on which the lightning strike 120 was incident. As mentioned earlier, one or more ICs 130 can be mounted on each of the components (150, 160, 170, or 180) of the structure 115, for example, on each of the blades 150 of a wind turbine 115. This arrangement would allow detecting which of the respective blades 150 has been affected by the lightning strike 120. The IC 130 coupled to the lightning receptor 110 which is nearest to the point of impact receives the lightning induced current and stores the lightning induced current as a transient waveform in the non-volatile memory 250. While IC 130 which is nearest the point of impact would receive a maximum amount of the lightning induced current, the other ICs 130, for example, the ICs 130 on other blades or nacelle may also detect some portion of the lightning induced current. Therefore, a history of such lightning incidents is recorded by each of the multiple ICs 130 over a given period of time as shown in Table 1. For example, the lightning strikes incident on the structure 115 over a period of several months may be stored and maintained as a "journal" in the non-volatile/flash memory 250 of each of the ICs 130. The journal provides an accurate representation of all individual lightning strikes hitting the structure 115, including the last strongest lightning strike.

As shown in Table 1, the lightning strikes are represented as sampled waveforms with associated timestamp data. The journal also keeps a count of the number of lightning strikes and the duration of each lightning strike to aid damage estimation. The incident lightning strikes are recorded in the journal one after the other in the order of occurrence. The journal may include other fields such as an identifier of the location of impact, an identifier of the component or structure, an identifier of the integrated circuit, etc. It is envisaged that the journal may be maintained in other formats such as ascending/descending order of lightning strike intensities, ascending/descending order of timestamp data, component wise classification of events, etc. Also, visual effects such as highlighting, text effects, running line, etc., may be applied on one or more journal entries to draw the attention of a reader for taking remedial measures.

TABLE 1

Journal of lightning incidents

| Event count | Duration | Waveform | Timestamp |
|---|---|---|---|
| 1 | <D1 mS> | <Sample 1><br><Sample 2><br>.<br>.<br>.<br><Sample n> | <T1: date1, time1> |
| 2 | <D2 mS> | <Sample 1><br><Sample 2><br><Sample 3><br>.<br>.<br>.<br><Sample n> | <T2: date2, time2> |
| 3 | <D3 mS> | <Sample 1><br>.<br>.<br>.<br><Sample n> | <T3: date3, time3> |
| 4 | <D4 mS> | <Sample 1><br><Sample 2><br>.<br>.<br>.<br><Sample n> | <T4: date4, time4> |

The damage estimation unit then determines a condition of the particular component (150, 160, 170, or 180) on which the IC 130 is mounted by analyzing the history of lightning incidents stored in the "journal" in the non-volatile memory 250. In an example, a condition of the blade 150 is estimated by determining a number (count) of lightning strikes 120 incident on the blade 150 and comparing a value of the number of lightning strikes against a predetermined threshold value. The determined threshold value may be set by an operator or be automatically calculated based on certain operational parameters like intensity of lightning strike, age of the structure, geographic location, time of year, atmospheric conditions, etc. In another example, a condition of the structure is estimated periodically by accumulating a value of the stored electrical parameter of each of the one or more lightning strikes and comparing the accumulated value against a determined threshold value. Again, the determined threshold value may be set by an operator or be automatically calculated based on certain operational parameters mentioned above. Since lightning strikes of low intensity can damage the component (150, 160, 170, or 180) overtime, the summing of individual electrical parameters enables measuring the overall incident energy rendered by the lightning strikes on the component (150, 160, 170, or 180). When an estimated condition of the component (150, 160, 170, or 180) indicates a need for maintenance, the IC 130 sends an alert signal via the wireless interface 270 to the remote service station 140 indicating that the particular component (150, 160, 170, or 180) needs maintenance. A service crew may then be dispatched to the site for maintenance. The generated alert may be transmitted wirelessly 272 through any of the wireless transmission protocols such as BLUETOOTH®, 802.11, 802.16, etc. The alert thresholds can be individually configured for structures, based on the structural features and limitations such as blade size, rating, manufacturer recommendations, turbine position, etc. The alert signal may also be sent to the service station 140 in real-time. Real-time is defined as the actual time in which the occurrence of an event and the reporting or recording of it is almost simultaneous minus the time it takes to process the particular signal. It should be appreciated that all the above disclosed steps of the method can be performed while the wind turbine 115 is in operation.

In an embodiment, the damage estimation unit 260 can be located anywhere in the structure or be located at a remote service station 140. In the latter case, the IC may then transmit the data stored in the memory 250 via a wireless interface 270 to the remote service station 140 for damage estimation. The system may further include an output interface 280 such as a display for rendering data stored in the non-volatile memory 250 and/or results from the damage estimation unit 260 within the IC 130.

Figure 3:
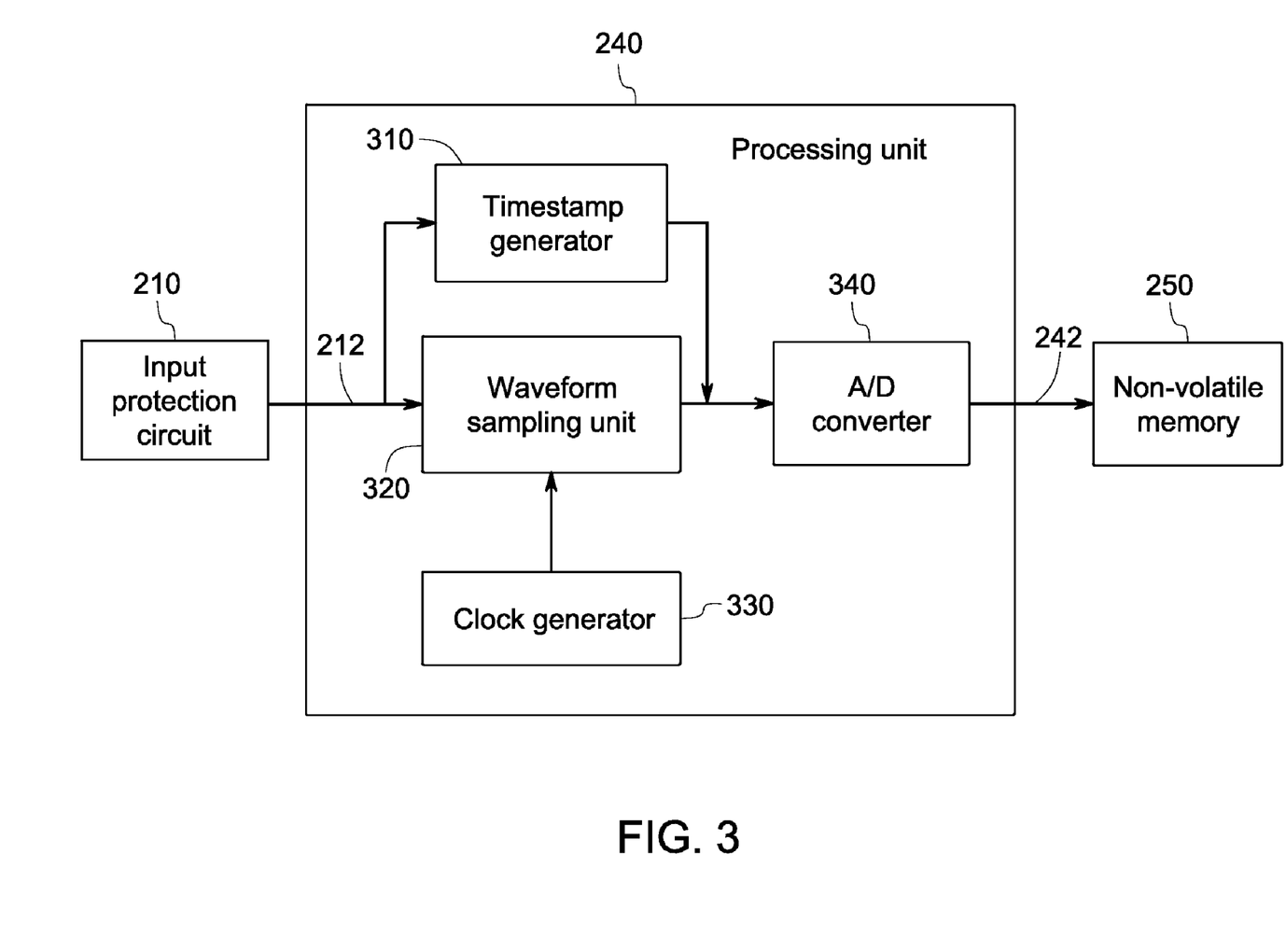
FIG. 3 is a block diagram representation of an exemplary processing unit employed in FIG. 2.

The processing unit 240 as shown in more detail in FIG. 3 includes a timestamp generator 310, a waveform sampling unit 320, a clock generator 330, and an analog-to-digital converter (ADC) 340. The time stamp generator 310 is used to generate timestamp data indicative of the time of incidence of a lightning strike on the component (150, 160, 170, or 180). The timestamp generator 310 may start-up in response to an actuation of a relay by the current passed by the pick-up coil 127 or a trigger provided by the voltage regulator from the energy harvesting unit 220. The timestamp generator 310 may also start up in response to sensing the current input to the sampling unit 320 and calculate a timestamp data with a delay factor. It should be appreciated that the processing unit 240 is not limited to any specific modality for triggering the time stamp generator 310. In particular, the functionality provided by relay may be provided by alternative modalities, such as may involve electro-optical components. The timestamp generator 310 may be coupled to a real-time clock synchronized with GPS time.

The waveform sampling unit 320 receives the current waveform 212 via the input protection circuit 210 and samples the current waveform at a sampling frequency range configured by the clock-generator 330. In one embodiment the sampling frequency may be in the 1-10 MHz range. The sampling frequency is configured by a clock-speed generated by the clock-generator 330. The sampling frequency determines how many samples are taken of a lightning waveform which may last e.g., 100-200 μsec. With an incident current waveform cutting off at about 10 kHz, the current waveform is oversampled at e.g., 1 MHz to avoid aliasing, improve resolution and reduce noise. Waveform sampling and digitization may start after the initial current spike powers up the voltage regulator circuit. For example, waveform sampling and digitization may start within about 300 ns from the time of lightning occurrence. The clock-generator 330 may be configured to start in response to the voltage regulator providing a trigger signal or based on actuation of a relay by the current induced in the pick-up coil 127.

Figure 4:
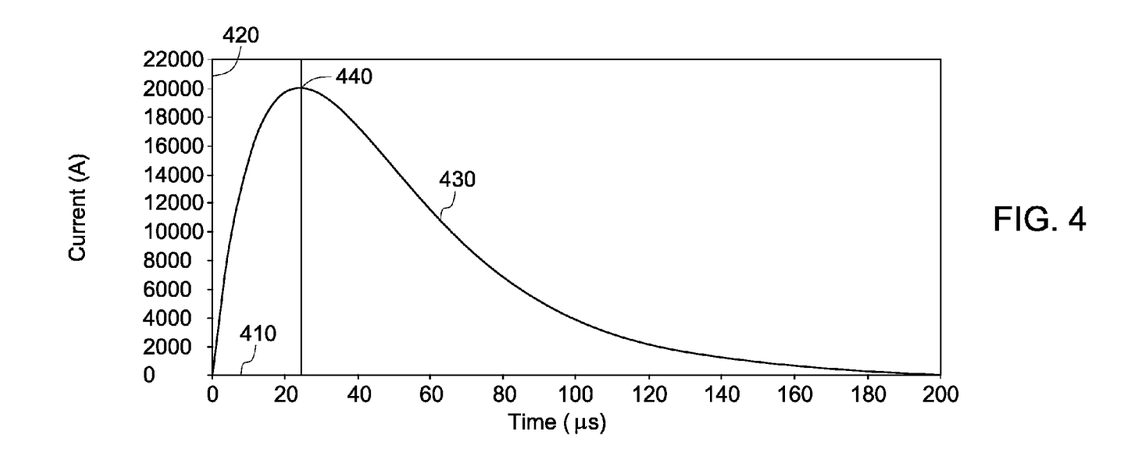
FIG. 4 is a schematic representation of an exemplary lightning current waveform generated from the lightning detection system in FIG. 1 in time domain in accordance with an embodiment of the invention.
Figure 5:
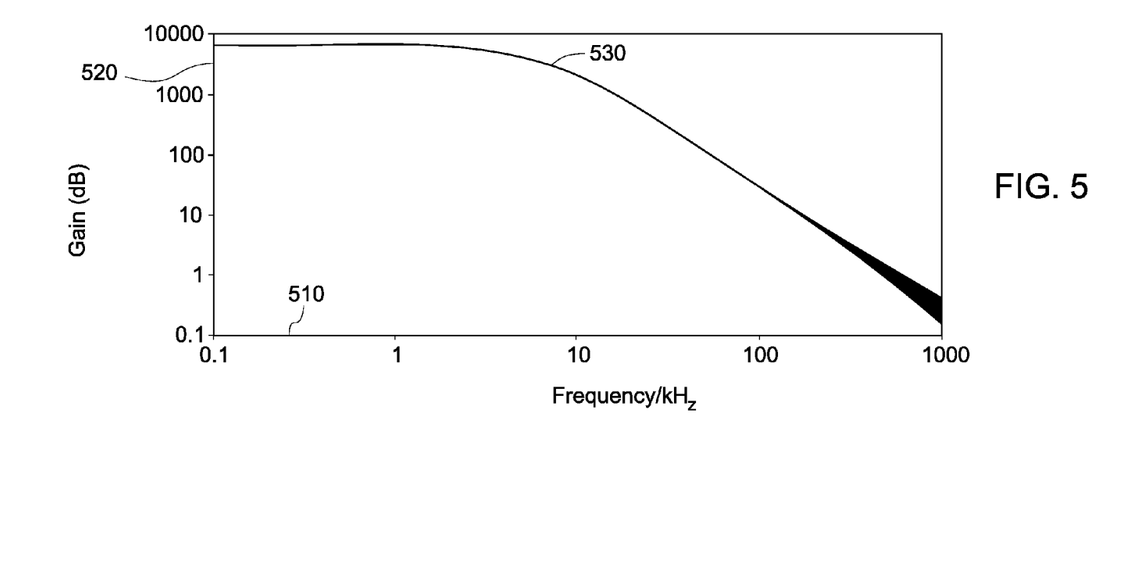
FIG. 5 is a schematic representation of the lightning current waveform in FIG. 4 in frequency domain.

A waveform of a sample lightning strike incident on the structure is shown in FIG. 4. The X-axis 410 represents time in μS and the Y-axis 420 represents lightning current in Amperes. Curve 430 represents a peak current 440 of the incident lightning strike having an intensity of e.g., around 20 kA and a voltage of e.g., 0-100 V amplitude. Similarly, in a frequency domain as illustrated in FIG. 5, where the X-axis 510 represents frequency in kHz and the Y-axis represents gain in dB, the current spike 530 has for example, a −3 dB gain and a cutoff frequency of about 10 kHz. The sampled current waveform is then fed to parallel comparators or other analog-to-digital converters 340 (FIG. 3) to digitize the waveforms. Each sample is digitized and stored in the non-volatile memory 250.

The generated timestamp data is stored in the non-volatile memory 250 (FIG. 3) along with a parameter of the lightning induced current, e.g., a transient waveform of the lightning induced current, the lightning strike induced voltage, the lightning induced magnetic field, the lightning strike induced electric field, a peak current, amount of electrical specific energy, or a combination thereof. Also, an identity of the component (150, 160, 170, 180 or 115) on which the IC 130 is located is stored in the non-volatile memory 250 in order to identify a respective blade 150 of the wind turbine 115 and/or a respective wind turbine 115 in a wind park. Thus, the timestamp data generated by the timestamp generator 310 in combination with the identifier of the component (150, 160, 170, or 180) would allow temporal and spatial determination of lightning activity. In other words, it is possible to identify which particular component (150, 160, 170, or 180) of the structure 115 was affected by the lightning strike and as well as a specific time of impact. This further allows the estimation of the condition of the component (150, 160, 170, or 180) based on accumulating the stored electrical values of the lightning strikes associated with the component (150, 160, 170, or 180) over a period of time. Also, the condition of the component (150, 160, 170, or 180) can be estimated using a count of the number of lightning strikes incident on a particular component (150, 160, 170, or 180).

Figure 6:
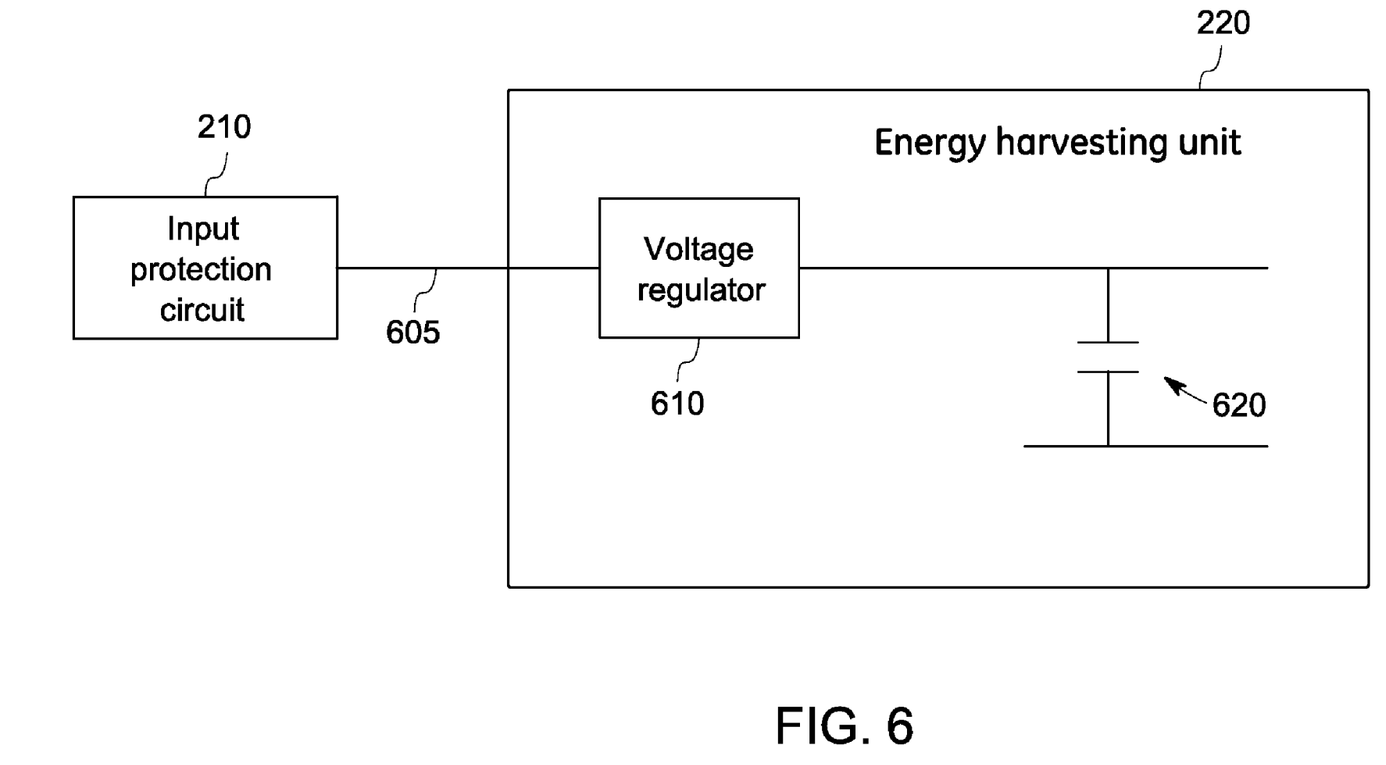
FIG. 6 is a block diagram representation of an exemplary energy harvesting unit employed in the lightning detection system in FIGS. 1 and 2 in accordance with an embodiment of the invention.

The energy harvesting unit 220 referred to above in FIG. 2 is discussed in more detail herein with respect to FIG. 6. The energy harvesting unit 220 is configured to harness and store energy from the lightning induced current to power the integrated circuit 130 (FIGS. 1 and 2). The energy harvesting unit 220 provides conditioned voltage and current levels to the components within the integrated circuit 130. The energy harvesting unit 220 employs a voltage regulator 610 to regulate an input voltage to a lower value. The voltage regulator includes a voltage divider that produces an output voltage that is a fraction of the input voltage. The voltage regulator 610 receives the current output 605 from the input protection circuit 210 and outputs a voltage suitable to operate the various components (240, 260, 270, and 280) within the integrated circuit 130 (FIG. 1). In one embodiment, the voltage regulator 610 outputs a voltage on the order of about 3 to about 5 volts. In another embodiment, a resistor based voltage divider may be used, where the output voltage is defined by a ratio of the resistances of resistors. In an exemplary embodiment, the resistors may be fixed resistors or variable resistors such as, but not limited to, a potentiometer.

Upon receiving the induced lightning current 605 from the input protection circuit 210, the voltage regulator 610 starts up and generates the needed integrated circuit voltages (e.g., 2.5V, 3.3V, 4V, 5V, and others) for powering various processing components including a write-circuitry for the non-volatile memory 250 (FIG. 2). The voltage regulator 610 feeds a charge pump and rectifier circuit within the power storage 230 (FIG. 2), which in turn powers the IC 130 (FIG. 2) and charges one or more output capacitors 620. The voltage regulator 610 may be configured to power the processing unit 240 (FIG. 2) followed by charging the output capacitor 620 to a suitable voltage (between about 2V to about 5V). The output capacitor 620 may further power other circuitry such as the time stamp generator 310 (FIG. 3), clock-generator 330 (FIG. 3), output interface 280 (FIG. 2), wireless interface 270 (FIG. 2), damage estimation unit 260 (FIG. 2), etc. Once the voltage regulator supply is regulated, harvested current is diverted to charging an optional power storage 230 such as a storage capacitor or rechargeable battery. This power storage 230 can be used to power the system in the event that the energy harvesting source is intermittent. Instead of a voltage regulator network, switched capacitor DC-DC converters may be used. Switched capacitor DC-DC converters are switching regulators which make use of switches and capacitors to perform voltage conversion.

Once the voltage regulator 610 starts supplying a stable voltage, the processing unit 240 records a signature (transient waveform) of the incident lightning strike along with a date and time stamp of the lightning strike as a new event in the non-volatile memory 250. The processing unit 240 may remain operational and record the waveform samples until the lightning induced current fades below a minimum threshold. The energy harvesting unit 220 may further include a regulated power supply, including a rectifier, a smoothing capacitor, a DC/DC converter and a regulator.

The output voltage from the voltage regulator is then rectified and stored in the power storage medium 230 for powering the various processing components within the IC 130. The use of the energy harvesting unit 220 makes it possible to produce a completely autonomous lightning detection system that is powered by harvested energy instead of batteries where battery replacement or servicing is inconvenient, costly or dangerous. Also, such a self-powered IC 130 arrangement allows for installing the IC 130 on rotary components (150, 160) of a structure 115 (FIG. 1) such as the blades of the wind turbine, where it is not feasible to have a continuous supply of power for powering various processing components. Moreover, the integrated circuit 130 powered by the harvested energy can be deployed for diverse applications such as wireless/automated condition monitoring, predictive maintenance and many other industrial applications.

In another embodiment, solar energy can be used as a source of power to the IC. In such an embodiment, one or more solar panels are mounted on the structure 115. In an embodiment, for example, the solar panels are solar cells such as photovoltaic cells which convert solar radiation from the sun into electricity. The one or more solar panels are coupled to the energy harvesting unit 220 which then harnesses and provides a regulated supply of power to the IC 130.

Figure 7:
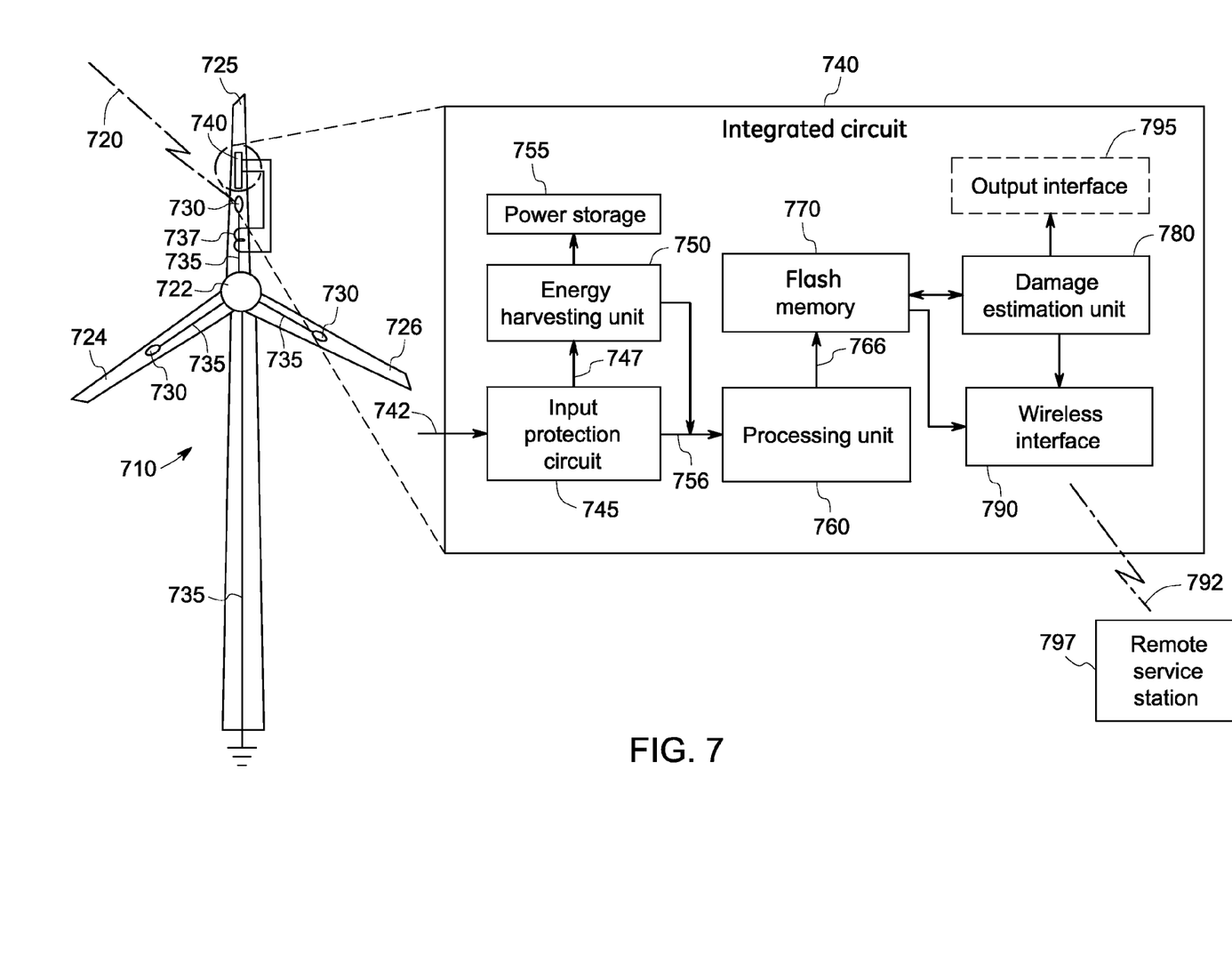
FIG. 7 is a schematic representation of an exemplary embodiment of a lightning detection system in accordance with embodiments of the invention.

An exemplary lightning detection and damage estimation system for a wind turbine according to embodiments of the invention is illustrated in FIG. 7. In the presently contemplated example, a lightning strike 720 strikes one of the blades (e.g., blade 725) of the wind turbine 710. One or more lightning receptors 730 located on the blade 725 and nearest the point of impact on blade 725 conduct the lightning current to ground via a lightning conductor 735. A pick-up coil 737 inductively coupled to the conductor 735 generates current proportional to the lightning current passing through the conductor 735 and channels the lightning induced current to an integrated circuit (IC) 740. The induced current 742 from the pick-up coil 737 is received by an input protection circuit 745 within the IC 740. The input protection circuit 745 includes resistive and diode networks for protecting the IC 740 from overvoltage and overcurrent surges. The current output 747 from the input protection circuit 745 is harnessed by an energy harvesting unit 750 and stored in a power storage medium 755 as a source of power for the various components (745, 750, 760, 770, 780, 790, and 795) within the IC 740. Further, the current output 756 by the input protection circuit 745 is sampled and digitized in the processing unit 760. The lightning current samples are further processed by a processing unit 760 to extract at least one lightning current samples of the lightning strike 720, such as a transient waveform of the lightning induced current. The digitized waveform 766 is stored in a flash memory 770 along with a timestamp generated by a timestamp generator within the processing unit 760. An identity of blade 725 is also stored in flash memory 770 along with the lightning strike parameters. When a subsequent lightning strike hits blade 725, all the above steps are repeated and a transient waveform of the lightning induced current is stored in the flash memory 770 in addition to the first lightning strike data. Similar steps are carried out for any number of lightning strikes that may occur on blade 725. A history of the lightning strikes incident on blade 725 is created likewise and stored in the memory 770.

Continuing with the above example, the lightning parameters stored in the flash memory 770 may pertain to several lightning strikes within a short period of time, say 80-160 ms. In other cases, the lightning parameters stored in the flash memory 770 may pertain to lightning activity occurring over a prolonged period of time e.g., three months. The history of lightning activity stored in the flash memory 770 along with an identity of blade 725 is wirelessly transmitted to a remote service station 797 where a condition of the blade 725 is estimated.

Alternately, a damage estimation unit 780 within the IC 740 estimates a condition of blade 725 using the history of stored lightning current samples of all lightning activities stored so far, or a selected subset of stored data. The damage estimation unit 780 sums the transient waveforms of all the lightning strikes including low intensity lightning strikes. The sum value of the lightning strikes is then compared against a predetermined threshold value. When the sum value exceeds the predetermined value, a need for maintenance is detected and an alarm signal is generated. Otherwise, the estimated condition is wirelessly 792 transmitted by a wireless interface 790 to the remote service station 797 along with an identity of blade 725. Alternately, the sum value of the accumulated lightning parameters is periodically transmitted to the remote service station 797 or manually read from an output interface 795 by inspection personnel using suitable reading means such as an RFID reader. The remote service station 797 may then take necessary maintenance measures for blade 725.

It will be appreciated that one need not include a respective lightning receptor 730 for each blade (724, 725, and 726). For example, a single IC 740 coupled to a lightning conductor 735 may be installed in a nacelle region 722 of the wind turbine 710 to detect a strike on the wind turbine 710. However, in such a configuration, one would not be able to determine a specific blade of the turbine that was struck and consequently, individual inspection of each of such blades may be performed.

It will be appreciated that aspects of the present invention may be conveniently used in a wind park made up of several of wind turbines, where a lightning detection system embodying aspects of the present invention may be configured to detect a lightning strike affecting at least one blade in at least one of the wind turbines of the wind park. A wind park service station may collect data from the respective ICs of the multiple wind turbines to process such data as described above.

Figure 8:
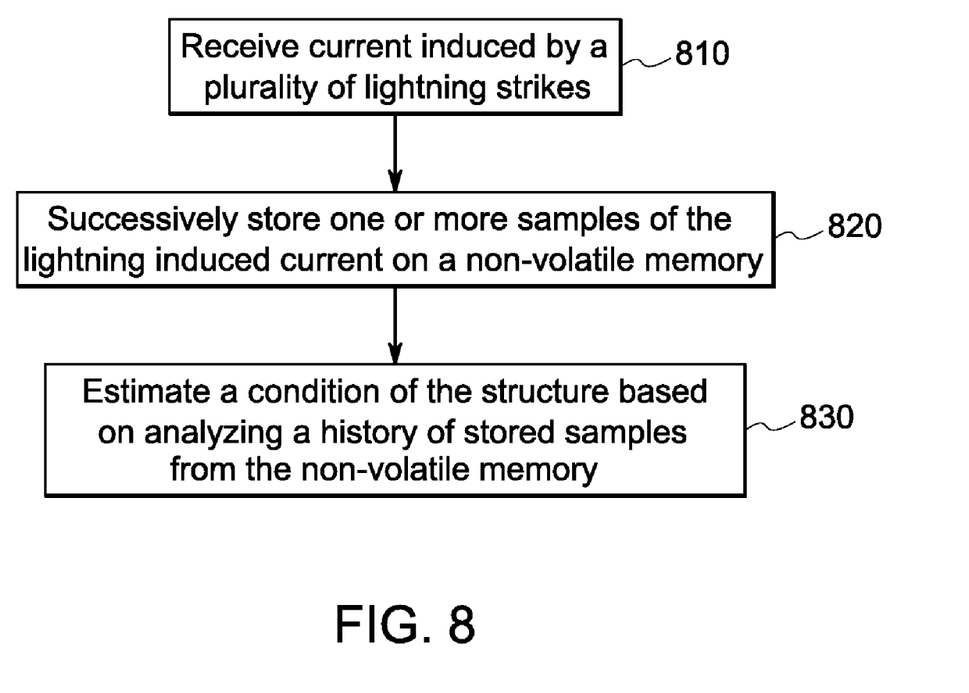
FIG. 8 is a flow chart representing steps involved in an exemplary method for detecting lightning in accordance with an embodiment of the invention.

FIG. 8 is a flow chart representing steps involved in an exemplary method in an integrated circuit (IC) for detecting lightning strikes on a structure. The method includes receiving current induced by one or more of a multiple lightning strikes via a lightning conductor coupled to the integrated circuit in step 810. The lightning current conducted through the conductor to ground induces a secondary current in a pick-up coil 127 (FIG. 1) coupled to the IC. One or more samples of the lightning induced current is generated and stored in a non-volatile memory. The method further includes creating a history of multiple lightning strikes by successively storing sampled lightning induced current for the multiple lightning strikes in the non-volatile memory in step 820.

A condition of the structure is estimated based on analyzing a history of stored lightning current samples of the multiple lightning strikes from the non-volatile memory in step 830. In one embodiment, a condition of the structure is estimated by determining a number of lightning strikes incident on the structure, and comparing a value of the number of lightning strikes against a predetermined threshold value. In another embodiment, a condition of the structure is estimated by accumulating a value of the stored lightning current samples of each of the multiple lightning strikes, and comparing the accumulated value against a predetermined threshold value. In yet another embodiment, data stored in the non-volatile memory is wirelessly transmitted to a remote service station while the structure is in operation. In another embodiment, harnessing energy is harnessed from the lightning induced current to power the lightning detection system.

In operation, a lightning detection system embodying aspects of the present invention is useful to perform targeted inspection, such as when a detrimental condition of the structure is likely to have gradually occurred over a period of time due to lightning strikes encompassing both low and high intensity lightning strikes. Thus, the benefits of the invention lie in a compact, self-powered integrated circuit having a non-volatile memory for storing a history of lightning strikes. Specifically, the method and system according to some embodiments of the invention enable distinguished damage estimation between the blades of the wind turbine and eliminate the need for on-site inspection and/or interrupted wind turbine operation.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An integrated circuit mounted on a structure for detecting lightning strikes, the integrated circuit comprising:
   a processing unit for sampling lightning induced current from a plurality of lightning strikes incident on the structure;
   a non-volatile memory for successively storing one or more samples of the lightning induced current for each of the plurality of lightning strikes; and
   an energy harvesting unit configured to harness energy from the lightning induced current to power the integrated circuit.

2. The integrated circuit of claim 1, wherein the integrated circuit is mounted on one or more of a plurality of components of the structure.

3. The integrated circuit of claim 2, wherein the processing unit comprises a timestamp generator to generate a timestamp indicative of the time of incidence of a lightning strike on the plurality of components and store the timestamp in the non-volatile memory.

4. The integrated circuit of claim 2, further comprising a damage estimation unit configured to estimate a condition of the plurality of components based on analyzing a history of stored samples of the lightning induced current for the plurality of lightning strikes from the non-volatile memory.

5. The integrated circuit of claim 4, wherein the damage estimation unit is configured to transmit an alarm signal in real-time when the estimated condition of the plurality of components indicate a need for maintenance.

6. The integrated circuit of claim 1, wherein the integrated circuit further comprises a wireless interface to wirelessly transmit data stored in the non-volatile memory to a remote service station.

7. The integrated circuit of claim 1, wherein a series of samples of the lightning induced current is used to extract a transient waveform of the lightning induced current for each of the plurality of lightning strikes.

8. The integrated circuit of claim 1, wherein the non-volatile memory is a flash memory.

9. The integrated circuit of claim 1, further comprising an input protection circuit for protecting the integrated circuit from overcurrent and overvoltage surges.

10. A lightning detection and damage estimation system for a structure, the system comprising:
    a lightning conductor to receive a plurality of lightning strikes and produce lightning induced current for each of the plurality of lightning strikes;
    an integrated circuit coupled to the lightning conductor and mounted on the structure, the integrated circuit comprising:
        a processing unit for sampling the lightning induced current for each of the plurality of lightning strikes;
        a non-volatile memory for successively storing one or more samples of the lightning induced current for each of the plurality of lightning strikes;
        a damage estimation unit for estimating a condition of the structure based on analyzing a history of stored samples of the lightning induced current for the plurality of lightning strikes from the non-volatile memory; and
        an energy harvesting unit configured to harness energy from the lightning induced current to power the integrated circuit.

11. The system of claim 10, wherein the lightning conductor comprises an electromagnetic coil responsive to an electromagnetic field induced by the lightning induced current resulting from the plurality of lightning strikes.

12. The system of claim 10, wherein the structure is at least one of a wind turbine, an aircraft structure, a marine structure, and a tower.

13. A method in an integrated circuit for detecting lightning strikes on a structure, the method comprising:
    receiving lightning current induced by each of a plurality of lightning strikes from a lightning conductor coupled to the integrated circuit;
    sampling the lightning current induced by each of the plurality of lightning strikes;
    successively storing on a non-volatile memory one or more samples of the the lightning current induced by each of the plurality of lightning strikes;
    measuring overall incident energy generated by each of the plurality of lightning strikes on a component of the structure; and
    estimating a condition of the structure based on analyzing a history of stored samples of the lightning current induced by each of the plurality of lightning strikes from the non-volatile memory.

14. The method of claim 13, wherein estimating the condition of the structure comprises:
    determining a number of lightning strikes incident on the structure; and
    comparing a value of the number of lightning strikes against a threshold value.

15. The method of claim 13, wherein estimating a condition of the structure comprises:

accumulating a value of the stored samples of the lightning current induced by each of the plurality of lightning strikes; and comparing the accumulated value against a threshold value.

16. The method of claim 13, further comprising wirelessly transmitting data stored in the non-volatile memory to a remote field service while the structure is in operation.

17. The method of claim 13, further comprising harnessing energy from the lightning current induced by each of the plurality to power a lightning detection system.

* * * * *